United States Patent
Noda et al.

(10) Patent No.: US 6,737,905 B1
(45) Date of Patent: May 18, 2004

(54) CLAMP CIRCUIT

(75) Inventors: Shinichi Noda, Okazaki (JP); Hideaki Ishihara, Okazaki (JP); Akira Suzuki, Nukata-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/374,695

(22) Filed: Feb. 26, 2003

(30) Foreign Application Priority Data

Feb. 26, 2002 (JP) ........................................ 2002-050008

(51) Int. Cl.[7] ........................... H03K 5/08; H03K 17/08
(52) U.S. Cl. ...................................... 327/323; 327/318
(58) Field of Search ............................... 327/309, 318, 327/319, 321, 323, 327, 328

(56) References Cited

U.S. PATENT DOCUMENTS

| | | | |
|---|---|---|---|
| 4,849,654 A | 7/1989 | Okada | |
| 5,479,119 A | 12/1995 | Tice et al. | |
| 5,488,324 A * | 1/1996 | Mizuta et al. | 327/77 |
| 5,606,275 A * | 2/1997 | Farhang et al. | 327/108 |
| 5,809,102 A | 9/1998 | Nakashiba | |
| 6,034,854 A | 3/2000 | Suga | |
| 6,586,984 B1 * | 7/2003 | Radke | 327/309 |

FOREIGN PATENT DOCUMENTS

| | | | |
|---|---|---|---|
| JP | 57-124464 | 8/1982 | ........... H01L/27/06 |
| JP | 61-24268 | 2/1986 | ........... H01L/27/08 |
| JP | 63-233560 | 9/1988 | ........... H01L/27/08 |
| JP | 4-347922 | 12/1992 | ............ H03K/5/00 |
| JP | 8-172162 | 7/1996 | ........... H01L/27/04 |
| JP | 9-129856 | 5/1997 | ........... H01L/27/12 |
| JP | 9-510790 | 10/1997 | ........... G01R/19/00 |
| JP | 10-98154 | 4/1998 | ........... H01L/27/04 |
| JP | 10-242391 | 9/1998 | ........... H01L/27/04 |
| JP | 2001-86641 | 3/2001 | ............ H02H/7/20 |

* cited by examiner

*Primary Examiner*—Timothy P. Callahan
*Assistant Examiner*—Terry L. Englund
(74) *Attorney, Agent, or Firm*—Harness, Dickey & Pierce, PLC

(57) ABSTRACT

The clamp circuit clamps an input voltage at prescribed higher and lower clamp voltages which are stabilized under a temperature fluctuation. Transistors Q12 and Q14 are switched on in their linear region. In a lower voltage clamp circuit 18, an Vin detecting circuit 20 outputs Va1 by level-shifting Vin by Q13 and voltage-divides by series resistance circuit 23 the level-shifted Vin, while a reference voltage generating circuit 21 outputs Vr1 by level-shifting 0 V by Q15 and voltage-divides by series resistance circuit 25 the level-shifted voltage. Q11 is switched on, when a comparator 22 determines that Va1 descends and goes across Vr1. Here, Q12 is of the same characteristics as Q14, while Q13 is of the same characteristics as Q15. Further, the resistance of the circuits 23 is the same as that of the circuit 25. The higher voltage clamp circuit 19 is similar to the circuit 18.

6 Claims, 2 Drawing Sheets

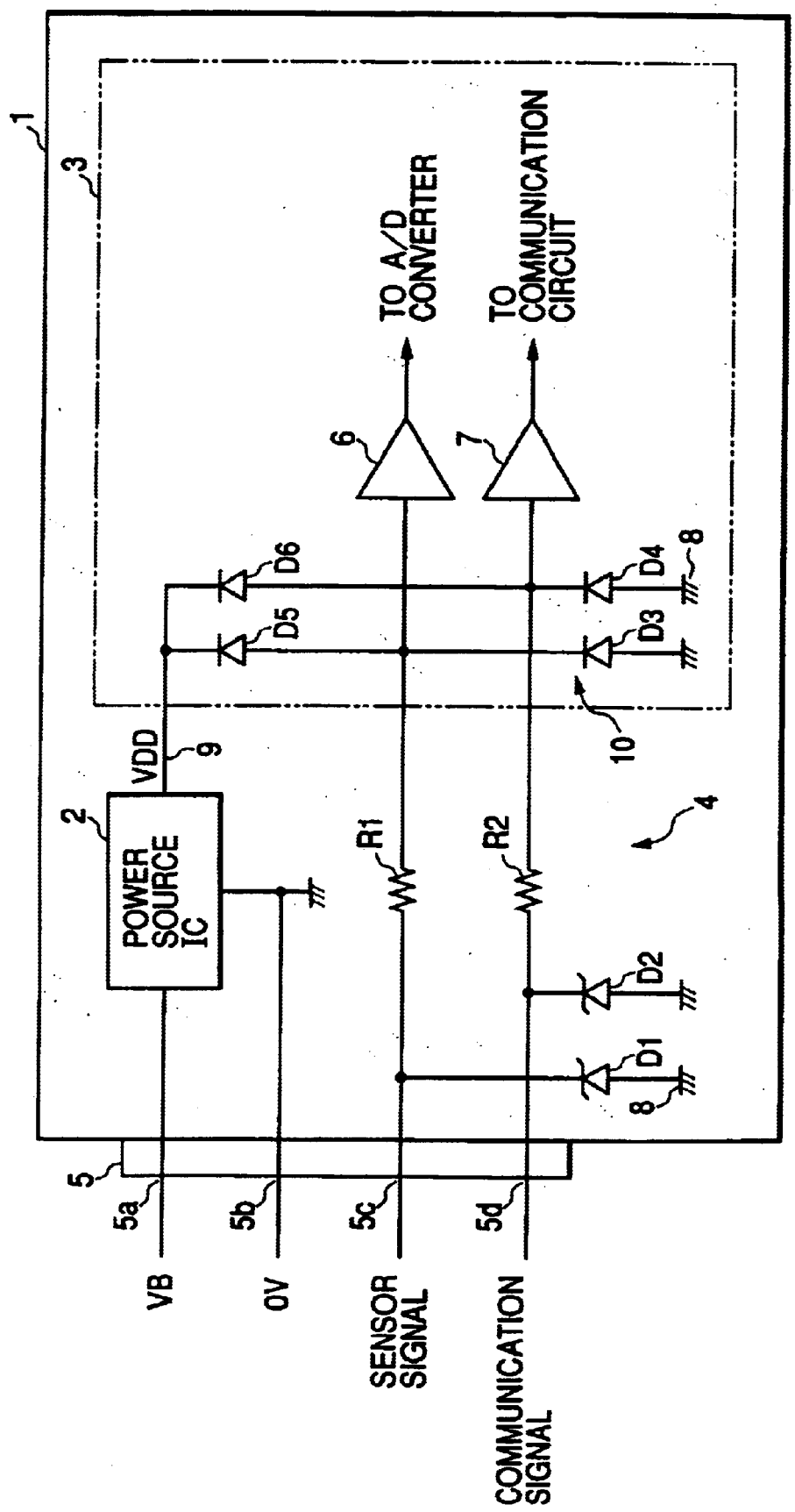
FIG. 2 *Related Art*

CLAMP CIRCUIT

BACKGROUND OF THE INVENTION

1. Field of the Invention

The present invention relates to a clamp circuit for clamping a voltage inputted into a signal input terminal in a semiconductor integrated circuit (IC).

2. Description of the Related Art

Recently, a large scale semiconductor IC (LSI) is manufactured in a smaller scale rule, in order to raise a response speed of the device and to reduce its chip area. Accordingly, for example, a thickness of a gate oxide film is made thinner, thereby causing such a necessity that a gate voltage be lower in order to ensure a sufficient device life and therefore, any overvoltage not be applied to the device in order to prevent a device destruction.

In order to lower the gate voltage, it is effective to employ a step-down circuit mainly used in an internal logic circuit in LSI for lowering a supply voltage. Further, in order to avoid an application of the overvoltage, it is effective to add a clamp circuit to a buffer circuit or interface circuit which is provided between the external signal input terminal and internal circuit. It is also effective to add the clamp circuit to an exterior of LSI.

FIG. 2 is an example of a conventional clamp circuit employed in an electronic control unit (ECU) of automobiles. As shown in FIG. 2, there are mounted, on a control substrate 1, a power supply IC 2 for inputting a battery voltage VB and outputting a supply voltage $V_{DD}$ of e.g., 5 V±5%; a control IC 3 for inputting such signals as sensor signal and communication signal and executing various controls; and an external clamp circuit 4 provided outside the IC 3.

The sensor signal inputted into a terminal 5c in a connector 5 and the communication signal inputted into a terminal 5d are further inputted through resistors R1 & R2, further through buffer circuits 6 & 7, respectively, into the control IC 3. In the exterior of the control IC 3, there are connected, between a ground 8 and terminals 5c & 5d, Zener diodes D1 and D2, respectively, of Zener voltage, e.g., 5.3 V. D1 and D2 construct the external clamp circuit 4.

Further, inside the control IC 3, there are connected diodes D3 and D4 between the ground 8 and each terminal of the buffer circuits 6 & 7, respectively, while there are connected diodes D5 and D6 between a control supply wire 9 and each terminal of the buffer circuits 6 & 7, respectively. The diodes D3 to D6 construct an internal clamp circuit 10 in the control IC 3.

Voltages inputted into the buffer circuits 6 and 7 are limited to greater than or equal to minus VF of about, e.g., minus 0.5 V and smaller than or equal to, e.g., 5.3 V, without depending upon the input signal levels. Accordingly, it becomes possible to employ MOS devices having withstand voltages of 5 V+10% (5.5 V) and minus 0.5 V which are manufactured by processes for low voltage devices. However, if the control IC 3 receives a larger number of input signals, the required number of the Zener diodes become larger, thereby increasing an area of the control substrate 1 and raising a production cost of the clamp circuit.

On the contrary, if the Zener diodes D1 and D2 are excluded, the upper voltage limit of the input signals become V+VF of about and less than 6 V, taking into consideration a fluctuation in $V_{DD}$ of 5 V±5%. Accordingly, the low withstand voltage device process can not be employed, but a high withstand voltage device process for, e.g., MOS having 6 V withstand voltage is required, thereby raising the production cost due to additive manufacturing processes and lowering the response speed. Further, the clamp circuits 4 and 10 have a disadvantage that the clamped voltage greatly fluctuates depending upon the temperature fluctuation.

SUMMARY OF THE INVENTION

An object of the present invention is to suppress a fluctuation of a clamped voltage due to the temperature fluctuation in a semiconductor IC.

According to the means as described in claim 1, the input voltage detecting circuit shifts by using a first transistor a level of a voltage inputted into a signal input terminal of an IC and outputs through the first resistance circuit a detected voltage. The reference voltage generating circuit shifts by using a second transistor a voltage of a second supply line and outputs through a second resistance circuit a reference voltage. The comparator compares the detected voltage with the reference voltage. The switching circuit switches on and off itself on the basis of a clamp instruction signal which is a comparison result by the comparator. Here, the detected voltage corresponds to the terminal voltage, while the reference voltage corresponds to a clamp voltage for the terminal voltage.

For example, when the higher voltage side is to be clamped, the switching circuit is switched off, if the detected voltage (terminal voltage) is smaller than or equal to the reference voltage (clamp voltage), thereby inputting the terminal voltage itself into an internal circuit formed in the IC. On the other hand, if the detected voltage (terminal voltage) is greater than the reference voltage (clamp voltage), the switching circuit is switched on, thereby lowering the terminal voltage down toward a pull-in voltage which is not greater than the clamp voltage. Then, when the terminal voltage becomes smaller than the clamp voltage, the switching circuit is switched off.

Thus, the terminal voltage can be clamped, against an overvoltage input, at a prescribed clamp voltage. According to the means as described in claim 1, only resistance elements are connected at the exterior of the IC for limiting an electric current, thereby reducing an area and cost of a substrate on which the IC is mounted.

Further, resistance circuits are connected in series with a level shift transistor both in the input voltage detecting circuit and reference voltage generating circuit, respectively. Therefore, the clamp voltage can be decided to be a prescribed voltage different from a second supply voltage by changing the resistance circuits in the input voltage detecting circuit and reference voltage generating circuit.

Further, the input voltage detecting circuit as well as the reference voltage generating circuit comprises a resistance circuit and a first & second transistors of the similar temperature characteristics, respectively. Therefore, the temperature characteristics of the detected voltage is almost the same as that of the reference voltage. Accordingly, the clamp circuit of the present invention has an advantage that the clamp voltage fluctuates little, even if the clamp circuit of the present invention is applied to such a device which is used under a wide temperature range, as an electronic control unit (ECU) for automobiles.

According to the means as described in claim 2, the clamp voltage is far more stabilized, because the total resistance value of the first resistance circuit is made equal to that of the second resistance circuit. Therefore, a temperature dependent fluctuation of the first resistance circuit becomes equal to that of the second resistance circuit.

According to the means as described in claim 3, the first and second resistance circuit are voltage divider constructed by a plurality of resistance elements. Therefore, the clamp voltage can be made to be an arbitrary value, by setting up an arbitrary voltage dividing ratio and outputting the detected voltage and reference voltage from an arbitrary voltage dividing points.

According to the means as described in claim 4, the third & fourth transistors connected between the first supply line and first & second resistance circuits, respectively, are switched on and off in accordance with an enable signal. Therefore, the current consumption in the clamp circuit can be reduced by allowing the electric currents to flow in the input voltage detecting circuit and reference voltage generating circuit only when the voltage clamping is required.

According to the means as described in claim 5, the third & fourth transistors connected between said first supply line and first & second resistance circuits, respectively, have the same characteristics, thereby supplying the input voltage detecting circuit and reference voltage generating circuit with the same bias currents. Therefore, the two circuits are balanced and the clamp voltage fluctuates little.

According to the means as described in claim 6, the input terminal voltage over a clamp voltage is clamped at the clamp voltage. Therefore, an input voltage into an A/D converter is held at a voltage at the time of starting the clamping operation, thereby obtaining a proper conversion result during the clamping operation.

BRIEF DESCRIPTION OF THE DRAWINGS

FIG. 2 is a circuit diagram of a conventional electronic control unit (ECU) having clamp circuits for automobiles.

PREFERRED EMBODIMENT OF THE INVENTION

Figure 1:
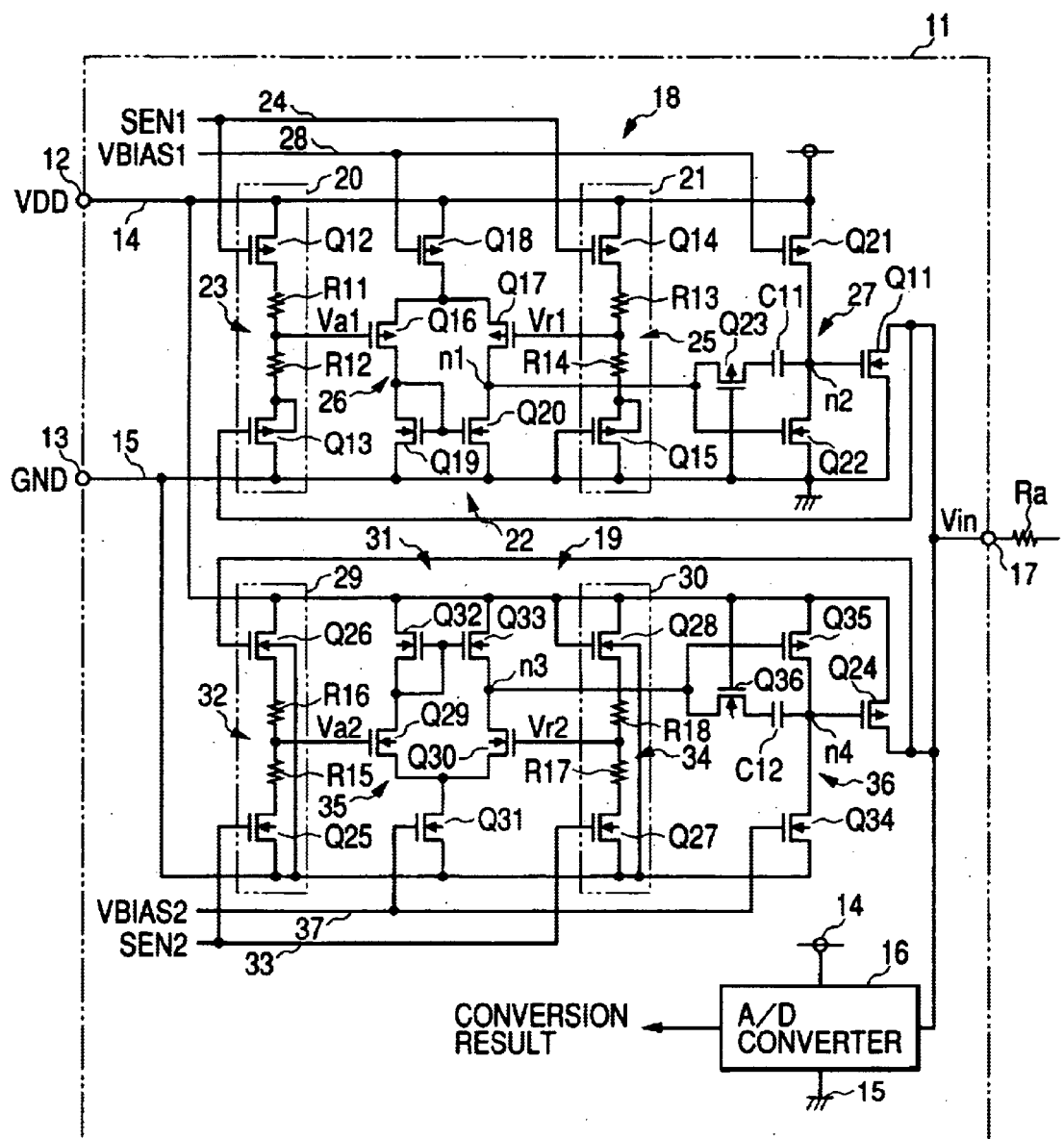
FIG. 1 is a circuit diagram of an IC provided with a clamp circuit of the present invention.

A preferred embodiment in accordance with the present invention are disclosed in detail, referring to FIG. 1 which shows a semiconductor IC for preventing a positive and negative overvoltage which might be caused by the voltages inputted into a semiconductor IC 11 mounted on a not-shown control substrate in an electronic control unit (ECU).

There is also mounted on the not-shown control substrate a not-shown power supply IC which allows the IC 11 to operate under $V_{DD}$ supplied through supply terminals 12 and 13 from the not-shown supply IC. Here an accuracy of $V_{DD}$ is, e.g., 5 V±5%. The supply terminals 12 and 13 are connected inside the IC 11 with a higher voltage supply line 14 and lower voltage supply line 15, respectively.

Although the IC 11 manufactured by the CMOS process includes not-shown various analog and digital circuits, only an A/D converter 16 is shown in FIG. 1. The higher voltage is e.g., 5.5 V and the lower voltage is e.g., minus 0.5 V, taking the product life into consideration. Further, in order to prevent the overvoltage across the above-mentioned limit from being applied to an input terminal 17 corresponding to a signal input terminal, the higher voltage side is clamped by a clamp circuit 18, while the lower voltage side is clamped by a clamp circuit 19.

The A/D converter 16 executes under a prescribed accuracy an analog to digital conversion of a voltage in a range, e.g., from 0.0 V to 5.0 V inputted from the input terminal 17. Although only one channel of the input terminal is shown, an actual IC is provided with multiple-channeled input terminals, A/D converters and multiplexers for which clamp circuits 18 and 19 are provided for each input terminal. Further, a resistance Ra is provided on the not-shown control substrate for limiting an electric current along signal routes toward each input terminal in the IC 11.

The clamp circuit 18 comprises: an input voltage detecting circuit 20; a reference voltage generating circuit 21; a comparator 22; an N channel transistor Q11 (switch) connected between the input terminal 17 and the supply line 15.

In the input voltage detecting circuit 20, a P channel transistor Q12 (3rd transistor), a series resistance circuit 23 (first resistance circuit comprising of a 1st resistance R11 and 2nd resistance R12) and a P channel transistor Q13 (1st transistor) are connected in series in this order. The source of Q12 is connected with supply line 14, R11 is connected with the drain of Q12, R12 is connected with the source of Q13 and the drain of Q13 is connected with the supply line 15. Here, a substrate terminal of Q13 is connected with its source. Further, the gates of Q12 and Q13 are connected with an enable signal line 24 and the input terminal 17, respectively.

In the reference voltage generating circuit 21, similar to the input voltage detecting circuit 20, a P channel transistor Q14 (4th transistor), a series resistance circuit 25 (2nd resistance circuit comprising of a 3rd resistance R13 and 4th resistance R14) and a P channel transistor Q15 (2nd transistor) are connected in series in this order. The source of Q14 is connected with supply line 14, R13 is connected with the drain of Q14, R14 is connected with the source of Q15 and the drain of Q15 is connected with the supply line 15. Here, the substrate terminal of Q15 is connected with its source. Further, the gates of Q14 and Q15 are connected with the enable signal line 24 and the supply line 15, respectively.

Here, characteristics of Q12 are made the same as that of Q14, while characteristics of Q13 are made the same as that of Q15.

The comparator 22 comprises: a differential amplifier circuit 26; and an output circuit 27. The differential amplifier 26 comprises: a P channel transistor Q16 of which gate (an inverted input terminal) is connected with a node of series resistance circuit 23 (voltage divider); and a P channel transistor Q17 of which gate (a non-inverted input terminal) is connected with a node of series resistance circuit 25 (voltage divider).

Further, a P channel transistor Q18 is connected between the supply line 14 and the source of the differential amplifier 26, while an active load circuit comprising N channel transistors Q19 and Q20 is connected between the drain of the differential amplifier 26 and supply line 15. Here, the gates of Q19 and Q20 are connected with each other at a connection point of Q16 and Q19. A connection point of Q17 and Q20 is an output node "n1" of the differential amplifier 26. Further, the gate of Q18 is connected with a bias line 28 which supply a bias voltage VBIAS.

An output circuit 27 includes: a P channel transistor Q21 connected with the supply line 14; and a N channel transistor 22 connected with the supply line 15. Q21 is connected in series with Q22. The output node "n1" of the differential amplifier 26 is connected with the gate of Q22. Further, "n1" is connected, through a P channel transistor Q23 and phase compensation capacitor C11, with an output node "n2" which is a connection point of Q21 and Q22. Further, "n2" is connected with Q11.

The clamp circuit 19, similar to the clamp circuit 18, comprises: an input voltage detecting circuit 29; a reference voltage generating circuit 30; a comparator 31; a P channel transistor Q24 (switch) connected between the input terminal 17 and the supply line 14.

However, a reference supply line of the clamp circuit 18 for clamping the lower voltage side is the supply line 15, while the reference supply line of the clamp circuit 19 for clamping the higher voltage side is the supply line 14. Thus, the clamp circuit 19 is constructed in such a manner that in the clamp circuit 18 the supply line 14 is interchanged with the supply line 15 and the channel type of each transistor is inverted.

The following elements in the clamp circuit 19; Q24 to Q36, R15 to R18, capacitor C12 and nodes "n3" & "n4" correspond respectively to the following elements in the clamp circuit; Q11 to Q23, R11 to R14, capacitor C11 and nodes "n1" & "n2". Further, the following elements in the clamp circuit 19; the series resistance circuits 32 & 34, the differential amplifier 35, the output circuit 36, the enable signal line 33 and the bias line 37 correspond respectively to the following elements in the clamp circuit 18; the series resistance circuits 23 & 25, the differential amplifier 26, the output circuit 27, the enable signal line 24 and the bias line 28.

Next, the protection against the overvoltage applied to the input terminal is explained.

First, the operation of the clamp circuit 18 for clamping the lower voltage side is explained. The enable signal SEN 1 given by the enable signal line 24 is L level (0 V) at a normal operation, thereby switching on Q12 and Q14 in their linear region, while they are switched off by H level SEN1 (VDD) when the IC 11 is set up to be a low power consumption mode.

When SEN1 is L level, the detected voltage Va1 outputted from the input voltage detecting circuit 20 is decided both by a level shifting by Q13 as a source follower and by a voltage dividing by the series resister circuit 23. Therefore, Va1 is expressed by formula (1).

$$Va1=Vin+VGS(Q13)+(R12/(R11+R12))(VDD \cdot VDS(Q12) \cdot VGS(Q13)-Vin) \quad (1)$$

where Vin is a voltage at the input terminal 17, VDS(Q12) is an absolute drain-source voltage of Q12, VGS (Q13) is an absolute gate-source voltage of Q13 and R11 & R12 are values of the resistance R11 & R12, respectively.

Similarly, the reference voltage Vr1 outputted from the reference voltage generating circuit 21 is decided both by a level shifting by Q15 as a source follower and by a voltage dividing by the series resister circuit 25. Therefore, Vr1 is expressed by formula (2).

$$Vr1=VGS(Q15)+(R14/(R13+R14))(VDD-VDS(Q14)-VGS(Q15)) \quad (2)$$

where VDS(Q14) is an absolute drain-source voltage of Q14, VGS (Q15) is an absolute gate-source voltage of Q15 and R13 & R14 are values of the resistance R13 & R14, respectively.

As already mentioned, the characteristics of Q12 is equal to that of Q14, and the characteristics of Q13 is equal to that of Q15. Therefore, $$VDS(Q12)=VDS(Q14)=VDS \quad (3)$$

$$VGS(Q13)=VGS(Q15)=VGS \quad (4)$$

Further, the value of series resistance of the series resistance circuit 23 is set equal to that of the series resistance circuit 25. Therefore, the electric current in the input voltage detecting circuit 20 becomes equal to that of the reference voltage generating circuit 21. Accordingly, the formulae (1) and (2) hold more rigorously, when Vin is nearly 0 V.

The comparator 22 compares Va1 with Vr1. The clamp voltage VCL1 which is Vin when the output from the comparator 22 is inverted is expressed by formula (5), by equating Va1 with Vr1 under formulae (3) & (4) and R11+R12=R13+R14.

$$VCL1=((R11-R13)/R11)(VDD-VDS-VGS) \quad (5)$$

For example, it is assumed in the present embodiment that the withstand voltage of the lower voltage side is, for example, minus 0.5 V, the A/D converter 16 converts the analog voltage Vin over 0.0 V, R11 is smaller than R13 and VCL1 is, for example, minus 0.25 V. If the absolute value of Vin ascends and goes across 0.25 V, then Q22 is switched off, thereby raising the voltage of "n2" and switching on Q11. Thus, the voltage of "n2" corresponds to a clamp instruction signal for instructing to start clamping Vin.

During the switching-on period of Q11, an electric current flows from the supply line 15 through Q11, the input terminal 17 and the resistance Ra in this order. Therefore, Vin ascends toward 0 V. Further, when Vin ascends and goes across VCL1, Q11 is switched off again. Thus, Vin is clamped at VCL1.

Further, the temperature characteristics of Va1 becomes almost the same as that of Vr1, because the structures and elements of input detecting circuit 20 are the same as those of the reference voltage generating circuit 21. Therefore, the electric currents flowing in the above-mentioned circuits are almost the same. Accordingly, VCL1 hardly fluctuates, even when the temperature of the IC 11 fluctuates.

Similarly, in the clamp circuit 19 for clamping the higher voltage side, Va2 and Vr2 outputted from the input voltage detecting circuit 29 and the reference voltage generating circuit 30, respectively, are expressed by the formulae (6) and (7), respectively.

$$Va2=Vin-VGS(Q26)-(R16/(R15+R16))(Vin-VDS(Q25)-VGS(Q26))$$

$$Vr2=VDD-VGS(Q28)-(R18/(R17+R18))(VDD-VDS(Q27)-VGS(Q28)) \quad (7)$$

As already mentioned, the characteristics of Q25 is equal to that of Q27, and the characteristics of Q26 is equal to that of Q28. Therefore, $$VDS(Q25)=VDS(Q27)=VDS \quad (8)$$

$$VGS(Q26)=VGS(Q28)=VGS \quad (9)$$

The clamp voltage VCL2 is expressed by formula (10), by equating Va2 with Vr2 under formulae (8) & (9) and R15+R16=R17+R18.

$$VCL2=VDD+((R17-R15)/R15)(VDD-VDS-VGS) \quad (10)$$

Here, for example, it is assumed in the present embodiment that: the withstand voltage of the higher voltage side is 5.5 V; the A/D converter 16 converts the analog voltage Vin smaller than 5.0 V; R17 is greater than R15; and VCL2 is 5.25 V. When Vin ascends and goes across VCL2, then Q35 is switched off, thereby lowering the voltage of "n4" and switching on Q24. Thus, the voltage of "n4" corresponds to a clamp instruction signal for instructing to start clamping Vin.

During the switching-on period of Q24, an electric current flows from the resistance Ra through the input terminal 17, Q24 and the supply line 14 in this order. Therefore, Vin descends toward 5 V. Further, when Vin descends and go across VCL2, Q35 is switched off again. Thus, Vin is clamped at VCL2. Further, VCL2 hardly fluctuates, even when the temperature of the IC 11 fluctuates.

As explained above, according to the clamp circuits 18 and 19, Vin at the input terminal 17 which is the input terminal of the A/D converter 16 is clamped at VCL1 and VCL2. Further, VCL1 and VCL2 are out of conversion range of the A/D convertor 16 and within the withstand voltages of device elements. Accordingly, the accuracy of A/D conversion of Vin is ensured and the IC 11 is protected against the overvoltage.

According to the present invention, the IC 11 is protected against the fluctuation not only in the external surge voltage, but also in a surge communication line voltage, when a communication line voltage happens to be raised to about, e.g., 1 V greater than VDD or lowered to about, e.g., 1 V smaller than the ground voltage, during a communication between the ECUs.

According to the present invention, the control substrate area of the IC 11 is reduced and cheaply manufactured, because the clamp circuits 18 and 19 are constructed inside the IC 11 and only Ra for limiting an electric current in the IC 11 is externally fixed. The area reduction and cost reduction are remarkable particularly for an IC with a lot of input terminals.

Further, the clamp voltages VCL1 and VCL2 can be set up to be out of VDD range which are smaller than or equal to 0V and greater than or equal to 5 V, respectively. This is because Va1 and Va2 are the level-shifted Vin outputted from the input voltage detecting circuits 20 and 29, respectively and Vr1 and Vr2 are outputted from the reference voltage generating circuits 21 and 30, respectively, similar to the circuits 20 and 29, respectively. VCL1 and VCL2 can be set up to be desired values by setting up suitable voltage dividing ratios of the series resistance circuits 23, 25, 32 and 34.

Further, Va1 and Va2 are made equal in their temperature characteristics to Vr1 and Vr2, respectively, by making equal the circuit currents in the input voltage detecting circuits 20 & 29 and the reference voltage generating circuits 21 & 30 each of which is provided with transistors with similar characteristics. Accordingly, VCL1 and VCL2 fluctuate little, even when the IC 11 is employed for ECU of which temperature characteristics fluctuates no little.

Further, the electric currents consumed in the clamp circuits 18 and 19 are greatly reduced by switching on the electric currents when they are required. This is carried out by Q12, Q25, Q14 and Q27 for intercepting the electric current under SEN1 and SEN2 inputted into the input voltage detecting circuits 20 &29 and the reference voltage generating circuits 21 & 30.

The present invention is not limited to the above-explained embodiment, but modifications and extensions thereof can be made within the scope of the present invention.

For example, Q12, Q14, Q25 and Q27 are not necessarily of similar characteristics, if the drain-source voltages thereof are sufficiently low. This is because they are mere switching elements.

Further, Q12, Q14, Q25 and Q27 may be supplied with bias voltages, thereby operating them under the same constant electric currents. Thus, the input voltage detecting circuit 20 or 29 balances with the reference voltage generating circuit 21 or 30, respectively. Consequently, VCL1 and VCL2 become not easily affected by the temperature fluctuation.

Further, Q12 and Q25 may be removed from the input voltage detecting circuits 20 and 29, respectively, while Q14 and Q27 may be removed from the reference voltage generating circuits 21 and 30, respectively. Even under those modifications, the similar operation and effect are obtained except for reducing the consumed current.

Further, each of the series resistance circuits 23, 25, 32 and 34 may be replaced by a single resistance or a series resistance of three or more resistances. The resistance may be a diffusion resistance, poly-silicon resistance, or a MOS transistor biased in a linear region.

Further, either one of the clamp circuit 18 or 19 may employed.

Further, the input terminal 17 is not limited to an analog input terminal. It maybe various input terminal such as digital general purpose port.

Further, the IC 11 may be manufactured by a bipolar process.

What is claimed is:

1. A clamp circuit which is incorporated in an IC and clamps an input voltage inputted into an input terminal of said IC, comprising:

an input voltage detecting circuit for outputting a detected voltage, wherein a first resistance circuit and a first transistor in a form of a source follower or emitter follower are connected in series between first and second supply lines and said input voltage is inputted into a control terminal of said first transistor and said detected voltage is outputted from said first resistance circuit;

a reference voltage generating circuit for outputting a reference voltage, wherein a second resistance circuit and a second transistor in a form of a source follower or emitter follower are connected in series between said first and second supply lines and a voltage of said second supply line is inputted into a control terminal of said second transistor and said reference voltage is outputted from said second resistance circuit;

a comparator for outputting an instruction signal instructing to clamp said input voltage, when said detected voltage goes across said reference voltage on the basis of comparison of said detected voltage with said reference voltage; and a switching circuit connected between said input terminal and said first or second supply line, said switching circuit being switched on, under such a condition that said instruction signal is outputted from said comparator.

2. The clamp circuit according to claim 1, characterized in that a series resistance of said first resistance circuit is equal to that of said second resistance circuit.

3. The clamp circuit according to claim 1, characterized in that:

said first and second resistance circuits are voltage-dividing circuits comprising a plurality of resistance elements; and said detected and reference voltages are outputted from a voltage dividing point of a respective voltage-dividing circuit.

4. The clamp circuit according to claim 1, which further comprises third and fourth tranansistors connected between said first supply line and said first and second resistance circuits, respectively, characterized in that said third and fourth transistors are switched on and off in accordance with an enable signal.

5. The clamp circuit according to claim 1, which further comprises third and fourth transistors connected between said first supply line and said first and second resistance circuits, respectively, characterized in that said third and fourth transistors output a respective bias current.

6. The clamp circuit according to claim 1, characterized in that said input terminal is an analog input terminal of an A/D converter in said IC.

* * * * *